United States Patent
Ren

(10) Patent No.: US 10,062,591 B2
(45) Date of Patent: Aug. 28, 2018

(54) EQUIPMENT PLATFORM SYSTEM AND WAFER TRANSFER METHOD THEREOF

(71) Applicant: SHANGHAI IC R&D CENTER CO., LTD., Shanghai (CN)

(72) Inventor: Daqing Ren, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 272 days.

(21) Appl. No.: 14/902,341

(22) PCT Filed: Sep. 26, 2013

(86) PCT No.: PCT/CN2013/084249
§ 371 (c)(1),
(2) Date: Dec. 31, 2015

(87) PCT Pub. No.: WO2015/014012
PCT Pub. Date: Feb. 5, 2015

(65) Prior Publication Data
US 2016/0141190 A1 May 19, 2016

(30) Foreign Application Priority Data
Aug. 1, 2013 (CN) .......................... 2013 1 0332646

(51) Int. Cl.
*H01L 21/67* (2006.01)
*H01L 21/677* (2006.01)

(52) U.S. Cl.
CPC .... *H01L 21/67196* (2013.01); *H01L 21/6719* (2013.01); *H01L 21/67201* (2013.01);
(Continued)

(58) Field of Classification Search
CPC .......... H01L 21/67201; H01L 21/6719; H01L 21/67757; H01L 21/67766;
(Continued)

(56) References Cited

U.S. PATENT DOCUMENTS 4,534,389 A * 8/1985 Tullis ..................... H01L 21/67
141/383
4,705,444 A * 11/1987 Tullis ................ H01L 21/67772
118/729
(Continued)

*Primary Examiner* — Glenn F Myers
(74) *Attorney, Agent, or Firm* — Tianchen LLC.

(57) ABSTRACT

An equipment platform system and a wafer transfer method used to a wafer processing is provided. The equipment platform system comprises: a working platform, each side of the working platform is used to mount process chamber; a top-loading wafer device fixed on the top surface of working platform, the top-loading wafer device includes: a cassette or FOUP loading unit, a wafer loading unit installed disposed opposite the cassette or FOUP loading unit, the wafer loading unit has an inside cavity; a central robot, located between the cassette or FOUP loading unit and the wafer loading unit; a loading gate used to open or close the inside cavity; a wafer tray, which is in the inside cavity; a shutoff gate, which is at the bottom of the inside cavity, used to open or close the internal of the working platform; there is an opening at the top of the working platform, the opening is located at the lower part of the inside cavity, and disposed opposite the shutoff gate, the shutoff gate can seal the opening. The equipment platform system of the invention can decrease the floor space, increase the space efficiency, and the wafer transfer efficiency.

18 Claims, 9 Drawing Sheets

(52) U.S. Cl.
CPC .. *H01L 21/67757* (2013.01); *H01L 21/67766* (2013.01); *H01L 21/67772* (2013.01); *H01L 21/67775* (2013.01); *H01L 21/67778* (2013.01); *H01L 21/67781* (2013.01)

(58) Field of Classification Search
CPC ......... H01L 21/67772; H01L 21/67781; H01L 21/67775; H01L 21/67167; H01L 21/67178; H01L 21/67196; H01L 21/67778; B25J 9/042; B25J 11/0095
See application file for complete search history.

(56) References Cited

U.S. PATENT DOCUMENTS

| | | | |
|---|---|---|---|
| 4,907,526 A * | 3/1990 | Walde | C23C 14/566 118/50 |
| 6,572,320 B2 * | 6/2003 | Davis | H01L 21/67754 294/119.1 |
| 6,942,738 B1 * | 9/2005 | Nelson | H01L 21/67754 134/33 |
| 2009/0060692 A1 * | 3/2009 | Wakabayashi | H01L 21/67265 414/222.02 |

* cited by examiner

--Prior Art--

--Prior Art--

-- Prior Art--

EQUIPMENT PLATFORM SYSTEM AND WAFER TRANSFER METHOD THEREOF

CROSS-REFERENCE TO RELATED APPLICATION

The application claims the priority benefit of International Patent Application Ser. No. PCT/CN2013/084249, filed Sep. 26, 2013, which is related to and claims the priority benefit of China patent application Ser. No. 201310332646.5 filed Aug. 1, 2013. The entirety of each of the above-mentioned patent applications is hereby incorporated by reference herein and made a part of the specification.

FIELD OF THE INVENTION

The present invention generally relates to the automatic transport field, more particularly, to an equipment platform system and a wafer transfer method thereof.

BACKGROUND OF THE INVENTION

With the development of semiconductor IC manufacturing technology, the wafer size increases from 150 mm, 200 mm to 300 mm or even bigger, the manufacturing cost of FAB is becoming more and more expensive. How to effectively exploit the limited production space of the FAB, improve the productivity of production equipment, shorten production cycle and the like are becoming more and more important.

Please referring to FIG. 1 and FIG. 2, FIG. 1 is a front view of a conventional equipment platform system, FIG. 2 is a top view of the conventional equipment platform system. The conventional equipment platform system of the FAB includes: a hexagonal working platform 102, a front-loading wafer device 101, which is located at the front of two sides of the hexagonal working platform 102; a process chamber 103, which is mounted at the other four sides of the hexagonal working platform 102; a built-in vacuum robot (not drawn), which is located in the hexagonal working platform 102, is used for carrying the wafers to each process chamber 103; the hexagonal working platform 102 has a wafer loading chamber 106, the front-loading wafer device 101 includes a cassette or FOUP (Front Opening Unified Pod) loading unit 105 and a robot (not drawn), is used for taking out the wafers from the cassette or FOUP loading unit 105, and placing the wafers in the wafer loading chamber 106; in addition, among equipment platform systems, an overhead transfer device 104 is used for carrying the cassette or FOUP.

Please referring to FIG. 3, FIG. 3 is the flow schematic of a conventional wafer transfer method. The conventional equipment platform system's transfer procedure of the wafer includes:

Step 21: the overhead transfer device 104 places the cassette or FOUP to the cassette or FOUP loading unit 105 of the front-loading wafer device 101;

Step 22: the robot of the front-loading wafer device 101 takes out the wafer from the cassette or FOUP and places it in the wafer loading chamber 106;

Step 23: the built-in vacuum robot of the hexagonal working platform 102 takes out the wafer from the wafer loading chamber 106, and place it in the process chamber 103.

In the condition of placement state of the front-loading wafer device, there are at least two wafer loading chamber 106 mounted at the sides of the hexagonal working platform 102 in general. However, the wafer loading chambers 106 occupy at least two mounting positions of the process chamber 103, so that the hexagonal working platform 102 can only mounts one to four process chamber 103, the space is not fully used, and the efficiency of the wafer transfer decreases.

BRIEF SUMMARY OF THE DISCLOSURE

In order to overcome the drawback mentioned above, the present invention provides an equipment platform system for wafer processes, so that the more process chambers can be mounted on, the wafer processes can be realizes uninterrupted, and the transfer efficiency of wafers is increasing.

The invention provides an equipment platform system for wafer processes, includes:
 a working platform, each of the sides of the working platform is used for mounting processes chamber;
 a top-loading wafer device, fixed at the top surface of the working platform; the top-loading wafer device includes:
  a cassette or FOUP loading unit, which is used for loading the cassette or FOUP;
  a wafer loading unit, used for loading the wafers, disposed opposite the cassette or FOUP loading unit, and the wafer loading unit has an inside cavity;
  a central robot, which has a rotatable arm, the central robot is located between the cassette or FOUP loading unit and the wafer loading unit, used to support the rotatable arm; the rotatable arm is installed on the central robot, and rotates around the central robot, used for transferring the wafers between the cassette or FOUP loading unit and the wafer loading unit;
  a loading gate, located on the wafer loading unit, disposed opposite the cassette or FOUP loading unit, the inside cavity of the wafer loading unit is opened or closed by the open/close of the loading gate;
  a wafer tray, locating in the inside cavity, and moving upward and downward for transferring wafer between the inside cavity and the internal of the working platform;
  a shutoff gate, located at the bottom of the inside cavity, the inside cavity and the internal of the working platform can be opened or closed at the same time by the open/close of the shutoff gate, in order to connect or separate the space of the internal of the working platform and the inside cavity;

The top of the working platform has an opening, the opening is under the inside cavity, used for the wafer tray carrying with wafers moves between the inside cavity and the internal of the working platform; the opening is disposed opposite the shutoff gate, and the shutoff gate can seal the opening.

Alternatively, the working platform is a hexagonal working platform.

Alternatively, the number of the process chambers mounted on the sides of the hexagonal working platform is six.

Alternatively, the internal of the working platform has a built-in vacuum robot, the arm of the built-in vacuum robot can extend to the lower part of the opening.

Alternatively, the wafer tray includes a wafer pallet and a retractable shaft.

Alternatively, the wafer pallet has a multilayer slot.

Alternatively, the size of the opening allows the wafer tray can pass the opening; and the every edge of the opening is smaller than the edge of the shutoff gate.

Alternatively, the direction of open/close of the loading gate is in vertical direction.

Alternatively, the central robot can move upward and downward.

Alternatively, the loading gate is disposed opposite the cassette or FOUP loading unit.

Alternatively, the plane that the shutoff gate is located is vertical to the plane that the loading gate is located.

Alternatively, the wafer loading unit also includes a vacuum pump, used for pumping the inside of the wafer loading unit keeping in the vacuum state.

The invention also provides a wafer transfer method which adopts above-mentioned the equipment platform system, the method includes a multi-wafer input procedure, the multi-wafer input procedure includes:

Step 01: the rotatable arm of the central robot takes out a wafer from the cassette or FOUP of the cassette or FOUP loading unit;

Step 02: the loading gate is opened, the rotatable arm carries the wafer to the wafer tray of the internal of the wafer loading unit, then the rotatable arm returns back to the outside of the loading gate, and moves to the cassette or FOUP to take the next wafer;

Step 03: the loading gate is closed, the vacuum pump pumps down the internal of the wafer loading unit keeping in a vacuum state is as same as the vacuum state of the working platform;

Step 04: the shutoff gate is opened, the arm of the built-in vacuum robot of the working platform moves to the lower part of the opening at the top of the working platform;

Step 05: the wafer tray carrying with the wafer moves downward, and passes the opening and enters the internal of the working platform, the arm of the built-in vacuum robot takes out the wafer from the wafer tray;

Step 06: the wafer tray moves upward, returns back to the internal of the wafer loading unit, and then the shutoff gate is closed;

Step 07: the arm of the built-in vacuum robot transfers the wafer into the process chamber, meanwhile, the Step 02 to Step 06 are carried out repeatedly, for transferring the next processed wafer;

Step 08: repeating the Step 01 to Step 07, for transferring the multi-wafer.

Alternatively, the method according to the wafer transmission also includes a multi-wafer output procedure, the multi-wafer output procedure includes:

Step 11: pumping the internal of the wafer loading unit keeping in a vacuum state by the vacuum pump, after the loading gate is closed;

Step 12: the wafer tray moves downward, passes the opening, and enters the internal of the working platform when the shutoff gate is opened;

Step 13: the arm of the built-in vacuum robot takes out the processed wafer from a process chamber and carries it to the wafer tray, then the arm of the built-in vacuum robot moves to the other process chamber to take out the next processed wafer;

Step 14: the wafer tray carrying with the wafer moves upward, returns back to the wafer loading unit, then the shutoff gate is closed;

Step 15: when the wafer loading unit vents to atmosphere, the loading gate is opened, the rotatable arm of the central robot takes out the wafer from the wafer tray, and places it into the cassette or FOUP of the wafer loading unit, meanwhile, the Step 11 to Step 14 are carried out repeatedly, for transferring the next processed wafer;

Step 16: repeating the Step 11 to Step 15, to transfer the multi-wafer.

Preferably, the multi-wafer input procedure and the multi-wafer output procedure can alternately be in progress.

Preferably, the wafer transfer method includes the multi-wafer input procedure, the multi-wafer input procedure includes:

Step 31: the arm of the central robot takes out the wafer from the cassette or FOUP of the cassette or FOUP loading unit;

Step 32: the arm moves between the cassette or FOUP and the wafer tray to transfer the multi-wafer until the multi-wafer have be carried in the wafer tray;

Step 33: then the loading gate is closed, the vacuum pump pumps down the internal of wafer loading unit and keeping in a vacuum state is as same as the vacuum state of the working platform;

Step 34: the shutoff gate is opened, the arm of the built-in vacuum robot of the working platform moves to the lower part of the top opening of the working platform;

Step 35: the wafer tray carrying with the wafer moves downward, passes the opening and enters the internal of the working platform, the arm of the built-in vacuum robot moves between the individual process chamber and the wafer tray to transfer the wafer, until the all of the wafers in the wafer tray be carried to the individual process chambers;

Step 36: the wafer tray moves upward, returns back to the internal of the wafer loading unit, and then the shutoff gate is closed;

Step 37: repeating the Step 31 to Step 36 to transfer the multi-wafer.

Preferably, the method according to the wafer transfer includes a multi-wafer output procedure, the multi-wafer output procedure includes:

Step 41: the vacuum pump pumps the internal of the wafer loading unit keeping in a vacuum state after the loading gate being closed;

Step 42: the shutoff gate is opened, the wafer tray moves downward and passes the opening to enter the internal of the working platform;

Step 43: the arm of the built-in vacuum robot moves between individual process chambers and the wafer tray to transfer the wafers, until all of the processed wafers are carried and placed into the wafer tray;

Step 44: the wafer tray with the wafers moves upward, and returns back to the wafer loading unit, then the shutoff gate is closed;

Step 45: when the wafer loading unit vents to atmosphere, the loading gate is opened, the rotatable arm moves between the cassette or FOUP and the wafer tray, to transfer the wafers, until all of the wafers on the wafer tray are carried and placed into the cassette or FOUP;

Step 46: repeating the Step 41 to Step 45, to transfer the multi-wafer.

Preferably, the multi-wafer input procedure and the multi-wafer out procedure are executed alternately.

The equipment platform system and the wafer transfer method of the invention realizes the wafers transfer from the cassette or FOUP loading unit to the wafer loading unit by means of adopting the top-loading wafer device. The cassette or FOUP loading unit, the wafer loading unit and the central robot are in the top-loading wafer device; and the loading gate is provided on the wafer loading unit, the vacuum state of the internal of the wafer loading unit can be keeping by opening or closing the loading gate, and avoid the vacuum state of the internal of the working platform may be destroyed during the transfer procedure. The wafer tray and the shutoff gate are installed on the internal of the wafer loading unit and the opening are installed at the top of the working platform disposed opposite the shutoff gate, which realizes the direct transfer of the wafers between the internal of the wafer loading unit and the internal of working platform, and the built-in vacuum robot moving between the wafer loading unit and the working platform to take out or place the wafer does not need. The cooperation of the open/close of the shutoff gate and the open/close of the loading gate, ensures the working platform always has been keeping in vacuum state during the wafer entering the internal of working platform, further ensures the process stability of the process chamber. So, the means by adopting the top-loading wafer device not only decreases floor space, increases space availability, but also increases the number of process chambers mounted on the working platform. For example, since the number of the process chambers mounted is six, the hexagonal working platform can realizes uninterrupted multi-steps processing when the process chambers are different, such as six steps, or three steps etc.; and the same process chambers of the hexagonal working platform can realizes the wafer processing of six wafers at the same time, further which can increase the transfer efficiency of the wafers and throughput.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Embodiment One

Hereinafter with reference to FIG. 4 to FIG. 7, the equipment platform system used for processing the wafers is explained in further detail by a first embodiment of the invention. It should be pointed out that all appended drawings adopt a very simplified form and imprecise scaling is merely used to assistant explain the embodiment of the invention conveniently and clearly.

Figure 1:
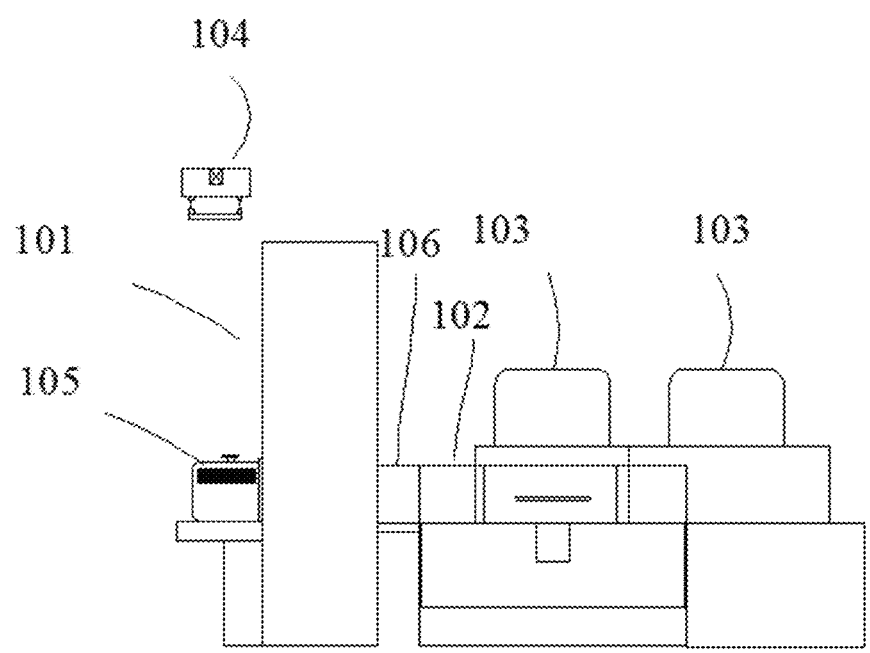
FIG. 1 is a front view illustrating of a conventional equipment platform system
Figure 2:
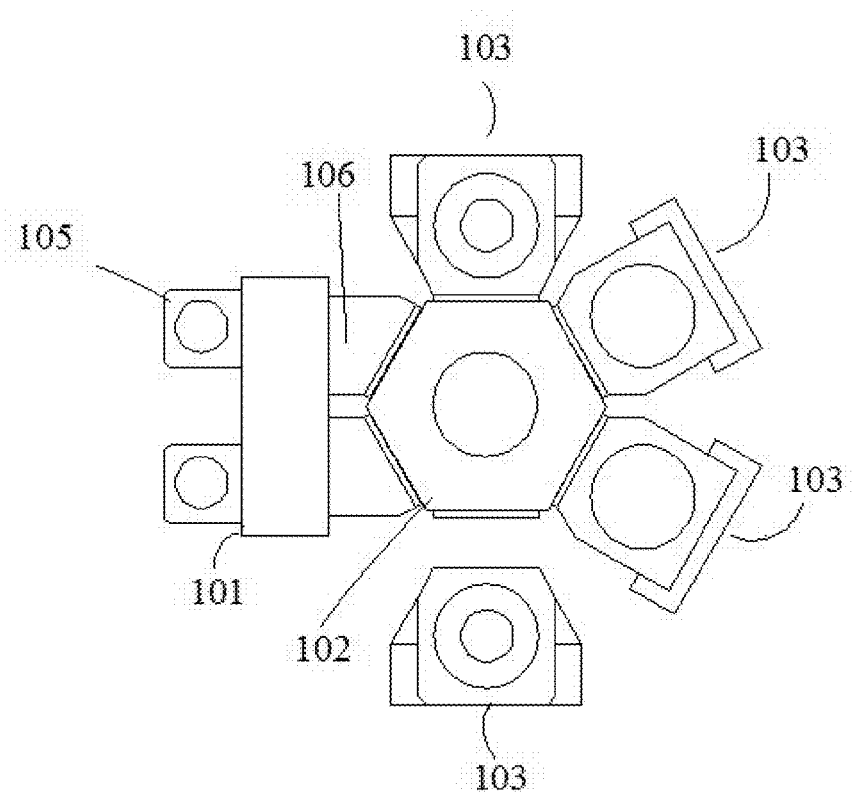
FIG. 2 is a top view of the conventional equipment platform system
Figure 3:
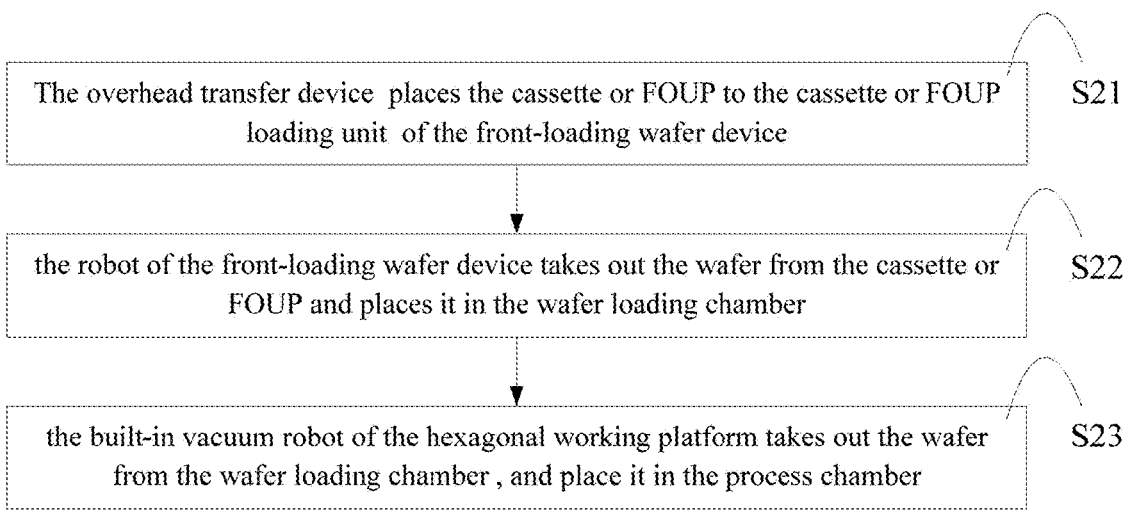
FIG. 3 is a flow diagram illustrating a conventional method according to the wafer transfer
Figure 4:
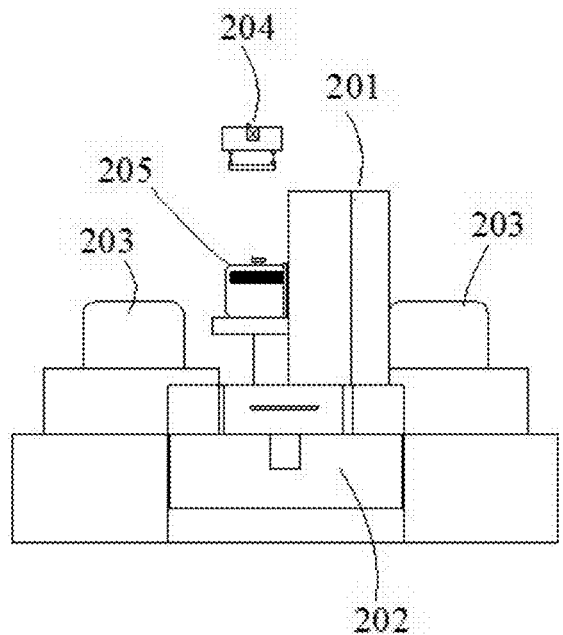
FIG. 4 is a front view illustrating an equipment platform system according to a first embodiment of the present invention
Figure 5:
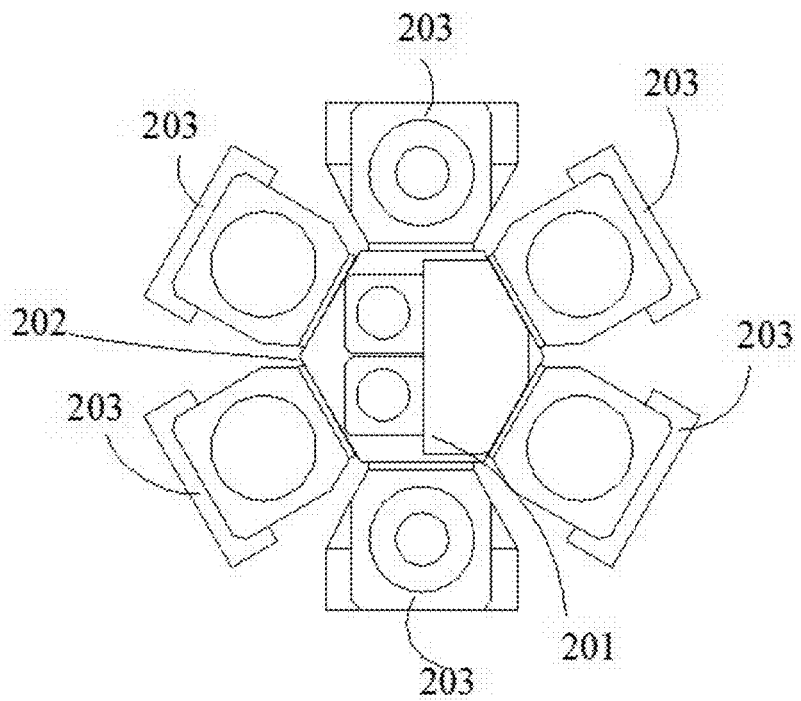
FIG. 5 is a top view of the equipment platform system according to the first embodiment of the present invention

Please referring to FIG. 4 and FIG. 5, FIG. 4 is a front view illustrating an equipment platform system according to the first embodiment of the present invention, FIG. 5 is a top view of the equipment platform system according to the first embodiment of the present invention. The working platform of the invention can, but not limited to, be a polygon working platform, such as a quadrilateral working platform, a pentagon working platform, a hexagon working platform, an octagon working platform, etc., an equipment platform system of one embodiment of the invention includes a hexagonal working platform and a top-loading wafer device.

Thereinafter taking equipment platform system with a hexagonal working platform as an example, further detailed explains the invention, but this does not used to limit the scope of the invention. The equipment platform system in the embodiment of the present invention has a top-loading wafer device 201, the top-loading wafer device 201 is fixed on the top surface of a hexagonal working platform 202, the way to fix the top-loading wafer device 201 can be adopt as mechanical fixation methods, such as screw, bolt, pin, riveting etc. or adopt chemical fixation methods, such as an epoxy resin bonding fixation etc., that is the fixation methods that can realize to fix the top-loading wafer device 201 is allowable; the sides of the hexagonal working platform 202 are mounted with process chambers 203; in the embodiment of the invention, also includes an overhead transfer device 204, which is used to transfer a cassette or FOUP to the top-loading wafer device 201.

Figure 6:
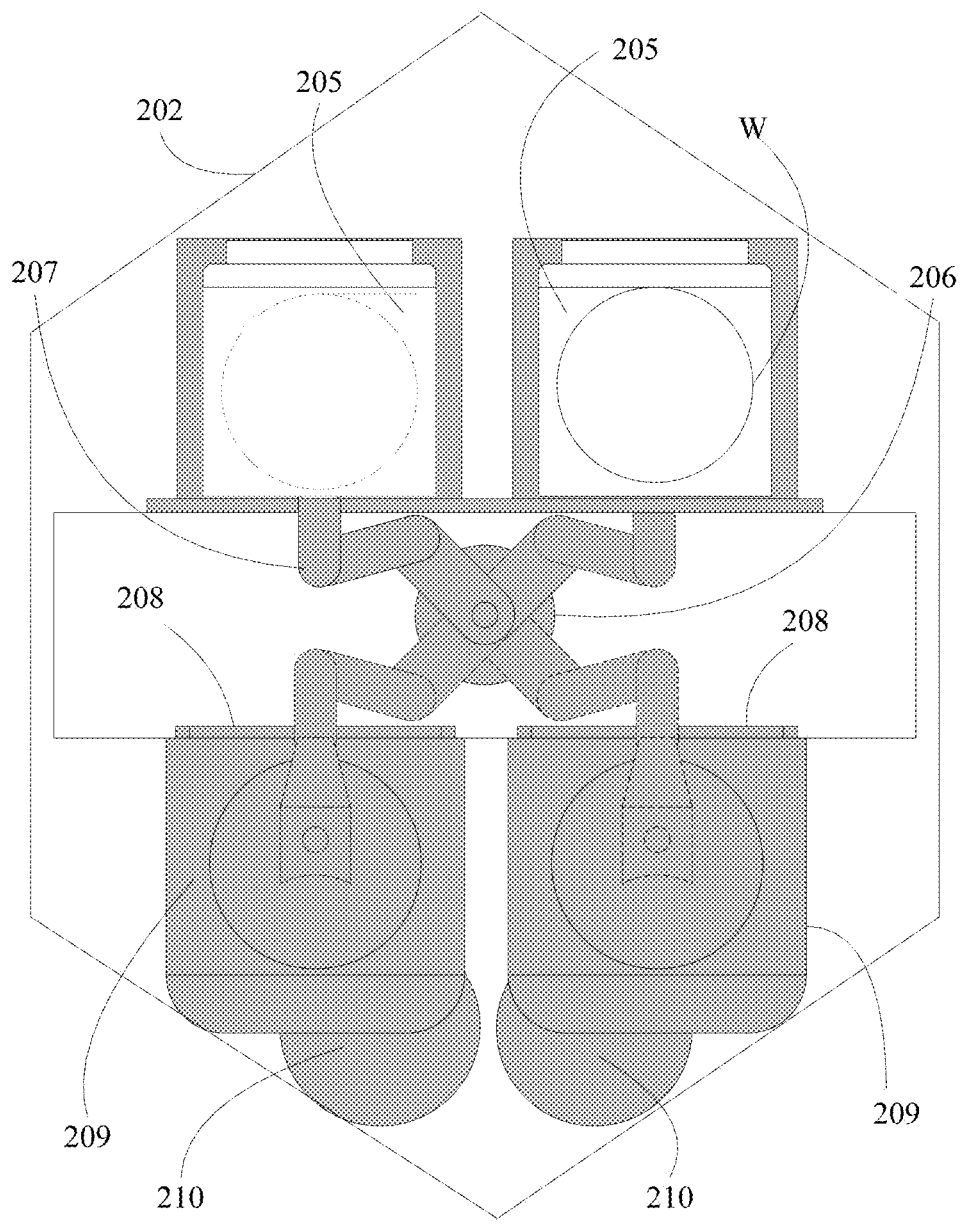
FIG. 6 is a top view of a wafer loading device according to the first embodiment of the present invention
Figure 7:
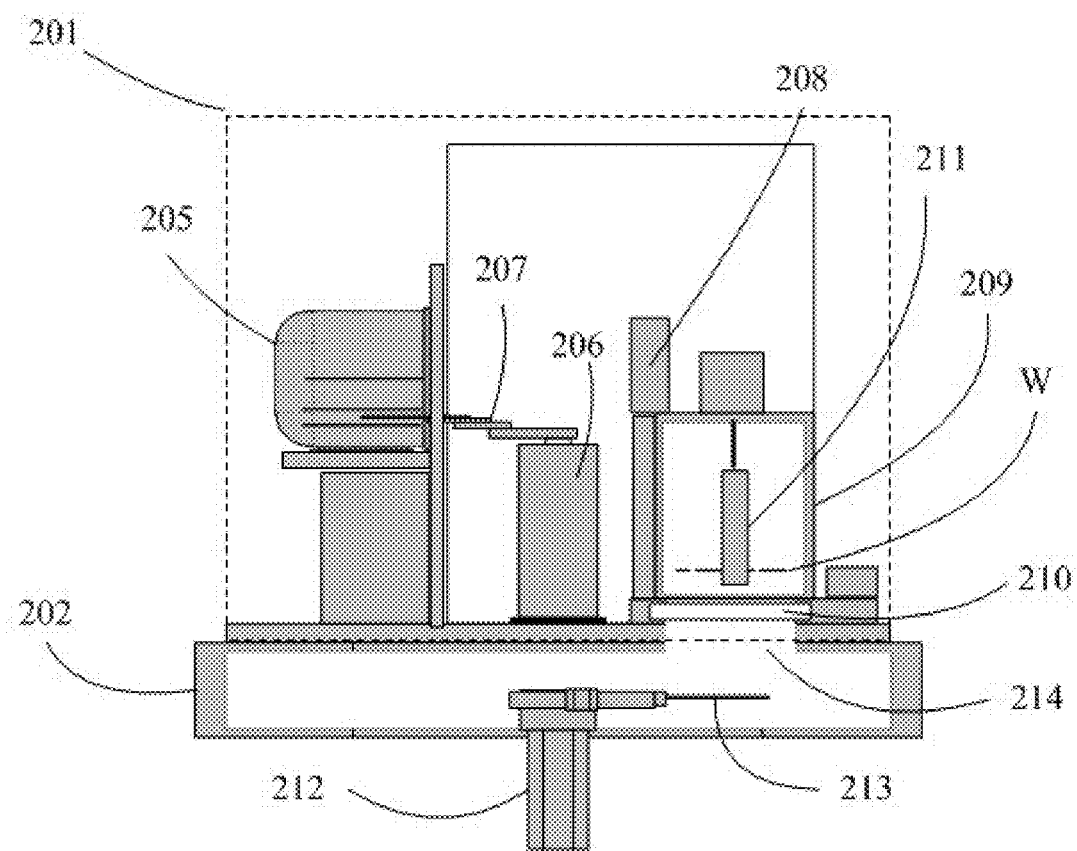
FIG. 7 is a cross-section drawn of the wafer loading device according to the first embodiment of the present invention

Refer to FIG. 6 and FIG. 7, FIG. 6 is a top view of a wafer loading device according to the first embodiment of the present invention. FIG. 7 is a cross-section drawn of the wafer loading device according to the first embodiment of the present invention.

In the first embodiment of the invention, there may be one process chamber 203 mounting or more process chambers 203 on one side of the hexagonal working platform 202 in accordance with realistic process requirements. Preferably, each side of the hexagonal working platform 202 according to the other embodiment of the present mounts one process chamber 203, so six process chambers 203 can be mount on the hexagonal working platform 202. It should be pointed out that the hexagonal working platform 202 can mount 1 to 6 process chamber(s) 203, the process chambers 203 can be the process chambers which perform the same process, also can be process chambers which perform the different processes, there are not limited in this invention.

In the first embodiment of the invention, the side edge of the top-loading wafer device 201 cannot exceed the side edge of the hexagonal working platform 202 in accordance with realistic process requirements, for every process chamber 203 can be mounted on the sides of the hexagonal working platform easily. In the realistic process, while the side edge of the top-loading wafer device 201 exceeds the side edge of the hexagonal working platform 202 a little, the mounting of the process chambers 203 can still be done. In the case, the mounting of the process chambers 203 will have some troubles, but the possibility of the side edge of the top-loading wafer device 201 exceeds the side edge of the hexagonal working platform 202 may not be excluded.

The top-loading wafer device 201 according to the other embodiment of the present invention includes:

A cassette or FOUP loading unit 205, located in the wafer loading device 201, used to carry a cassette or FOUP;

a wafer loading unit 209, located in the wafer loading device 201 and disposed opposite the cassette or FOUP loading unit 205, which has an inside cavity for loading wafers.

In the embodiment of the invention, the number of the cassette or FOUP mounted on the cassette or FOUP loading unit 205 at the same time can be one or two, preferably can be two. The number of the wafers loaded on the wafer loading unit 209 at the same time can be one to two, preferably can be two. In order because respectively adopting two cassette or FOUP loading unit and two wafer loading unit can prolong service life, and the transfer efficiency of wafers can be increased. When one of both is failure, the whole wafer loading device will be led to failure in case that one cassette or FOUP loading unit and one wafer loading unit have been adopted.

A central robot 206, which is located between the cassette or FOUP loading unit 205 and the wafer loading unit 209, in the embodiment of the invention, the central robot 206 can move upward and downward, in order helpful to take out the wafers W from different slot of the cassette or FOUP.

Specifically, the central robot 206 has a rotatable arm 207, the rotatable arm 207 is on the central robot 206, the rotatable arm 207 can rotate and flex within 0-360 degree, used to transfer wafers W between the cassette or FOUP loading unit 205 and the wafer loading unit 209.

In the first embodiment of the invention, the central robot 206 has a rotatable arm 207, the wafers can be taken out from the cassette or FOUP loading unit 205 and carried to the wafer loading unit 209, also the wafers can be taken out from the wafer loading unit 209 and carried to the cassette or FOUP loading unit 205 by the rotating of the rotatable arm 207. In order to be able to take or carry wafer W in time, the rotatable arm 207 can rotate any angle within 0-360 degree, and has higher flexibility.

A loading gate 208, located on the wafer loading unit 209, is disposed opposite the cassette or FOUP loading unit 205. The wafer W can be moved to or removed from the inside cavity of the wafer loading unit 209 by the open or close of the loading gate 208; meanwhile the inside cavity of wafer loading unit 209 is opened or closed by the open or close of the loading gate 208.

In the first embodiment of the invention, the wafer W is in the atmosphere when be transferred from the cassette or FOUP loading unit 205 to the wafer loading unit 209, when the hexagonal working platform 202 is under work and keeping in vacuum state, the installation of the loading gate 208 is used to close the inside cavity of the wafer loading unit 209 for next step to pump down the wafer loading unit 209 keeping in a vacuum state. In the embodiment of the invention, the loading gate 208 can be disposed opposite the cassette or FOUP loading unit 205, the open/close direction of the loading gate 208 is at vertical direction, so that the loading gate 208 can move upward or downward to open or close the inside cavity of the wafer loading unit 209.

A wafer tray 211, can be moved upward and downward, is located in the inside cavity of the wafer loading unit 209, used to transfer the wafer W to the built-in vacuum robot 212 of the internal of the hexagonal working platform 202. The hand 213 of the built-in vacuum robot is used for transferring wafers. In the embodiment of the invention, the wafer tray 211 includes: a wafer pallet and a retractable shaft, wherein, the wafer pallet can be arbitrary shape, such as round or square etc., the retractable shaft is used to support the wafer pallet and drive the wafer pallet to move upward or downward.

Figure 8:
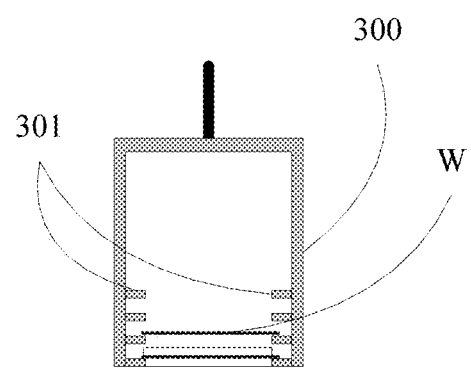
FIG. 8 is a front view illustrating a wafer tray according to the first embodiment of the present invention

In the first embodiment of the invention, the wafer pallet having a multi-slot 301, used to store multi wafers. As shown in FIG. 8, FIG. 8 is a front view illustrating a wafer tray according to an embodiment of the present invention, the wafer pallet 300 is with the multi-slot 301, the wafer W is placed at each layer of the multi-slot 301.

A shutoff gate 210 is located at the bottom of the inside cavity of the wafer loading unit 209, the inside cavity and the internal of the hexagonal working platform 202 can be opened or closed through the opening or closing off the shutoff gate 210, so that the internal of the hexagonal working platform 202 and the inside cavity are in a connected or blocking state. In the embodiment of the invention, the opening/closing direction of the shutoff gate 210 can, but not limited to, move along a horizontal direction, or rotate in a horizontal plane, the plane which the shutoff gate 210 is on is vertical to the plane which the loading gate 208 is on.

An opening 214 is located at the top of the hexagonal working platform 202, the opening 214 is at the lower part of the inside cavity and is disposed opposite the shutoff gate 210, used to connect the internal of the hexagonal working platform 202 and the internal of the wafer loading unit 209, the shutoff gate 210 can seal the opening 214.

In the first embodiment of the invention, the size of the opening 214 should meet the following conditions: the wafer tray 211 can pass the opening 214; and the every edge size of the opening 214 is smaller than the edge size of the shutoff gate 210, so that not only the wafer tray 211 can pass the opening 214, but also the shutoff gate 210 can seal the opening 214, in order to facilitate to vacuum the wafer loading unit 209.

In an actual process, it is demanded that when the shutoff gate 210 is opened, the opening 214 of the hexagonal working platform 202 is connected with the inside cavity of the wafer loading unit 209; when the shutoff gate 210 is closed, the opening 214 of the hexagonal working platform 202 and the inside cavity of the wafer loading unit 209 have been cut off each other, and the shutoff gate 201 can tightly seal the internal of the hexagonal working platform 202, meanwhile, also can tightly seal the inside cavity of the wafer loading unit 209. In the way, it can ensure the inside cavity and the internal of the hexagonal working platform keeping in vacuum state, particularly when the wafer tray 211 moves upward/downward to transfer the wafer, the inside cavity and the internal of the hexagonal working platform 202 are keeping in vacuum state at the same time, it is demanded that the shutoff gate 210 has good sealing property, in other words, that is sealing the internal of the hexagonal working platform 202 and the inside cavity of the wafer loading unit 209 tightly. In short, the shutoff gate 210 can close or open the internal of the hexagonal working platform 202 and the inside cavity of the wafer loading unit 209 at the same time.

Therefore, in the actual installation process, the inside cavity of the wafer loading unit 209 can be located over the upper part of the opening 214 by a deviation adjustment procedure, and the shutoff gate 210 be disposed opposite the opening 214, then do the installation and fixing.

In the embodiment of the invention, the internal of the hexagonal working platform 202 also includes a built-in vacuum robot, the arm of the built-in vacuum robot can extend to the lower part of the opening 214, when the wafer tray 211 carrying the wafers moves downward to the lower part of the opening 214, the arm of the built-in vacuum robot can touch the wafer, and takes out the wafer from the wafer tray 211, and sends the wafer to the corresponding process chamber, meanwhile, after the wafer is processed, the arm of the built-in vacuum robot can send the wafer to and place it into the wafer tray 211 which is at the lower part of the opening 214.

In the embodiment of the invention, the wafer loading unit 209 also includes a vacuum pump, which is used to pump the internal of the wafer loading unit 209 keeping in the vacuum state.

The equipment platform system according to the embodiment of the present invention increases the number of process chambers that can be mounted on the hexagonal working platform. Since the number of the process chambers can be mounted is six, the hexagonal working platform can realizes uninterrupted multi-steps processing when the process chambers are different, such as six steps, or three steps etc.; and the same process chambers of the hexagonal working platform can realizes the wafer processing of six wafers at the same time, further which can increase the transfer efficiency of the wafers.

Embodiment Two

Figure 9:
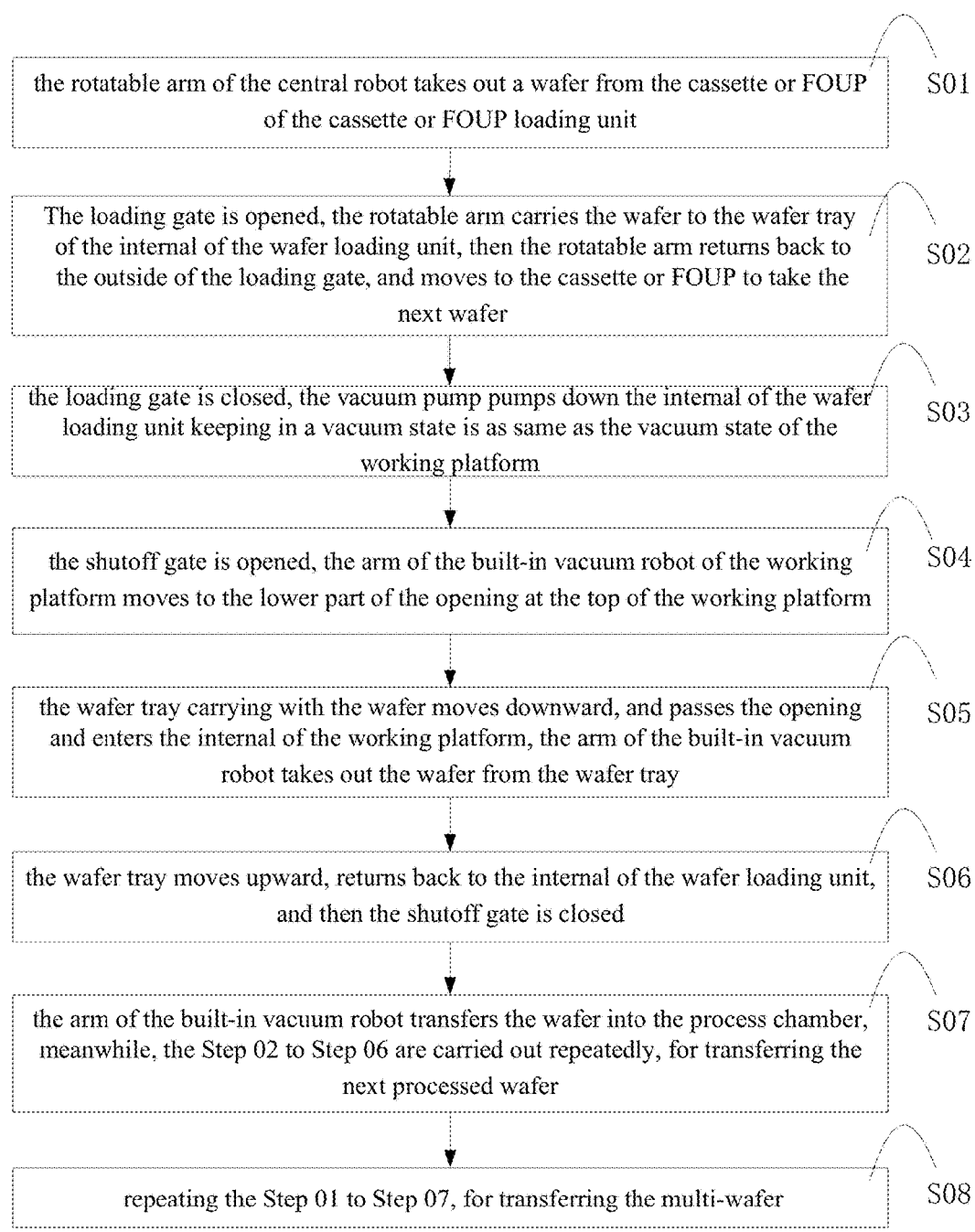
FIG. 9 is a flow diagram illustrating a method according to the wafer transfer according to the second embodiment of the present invention
Figure 10:
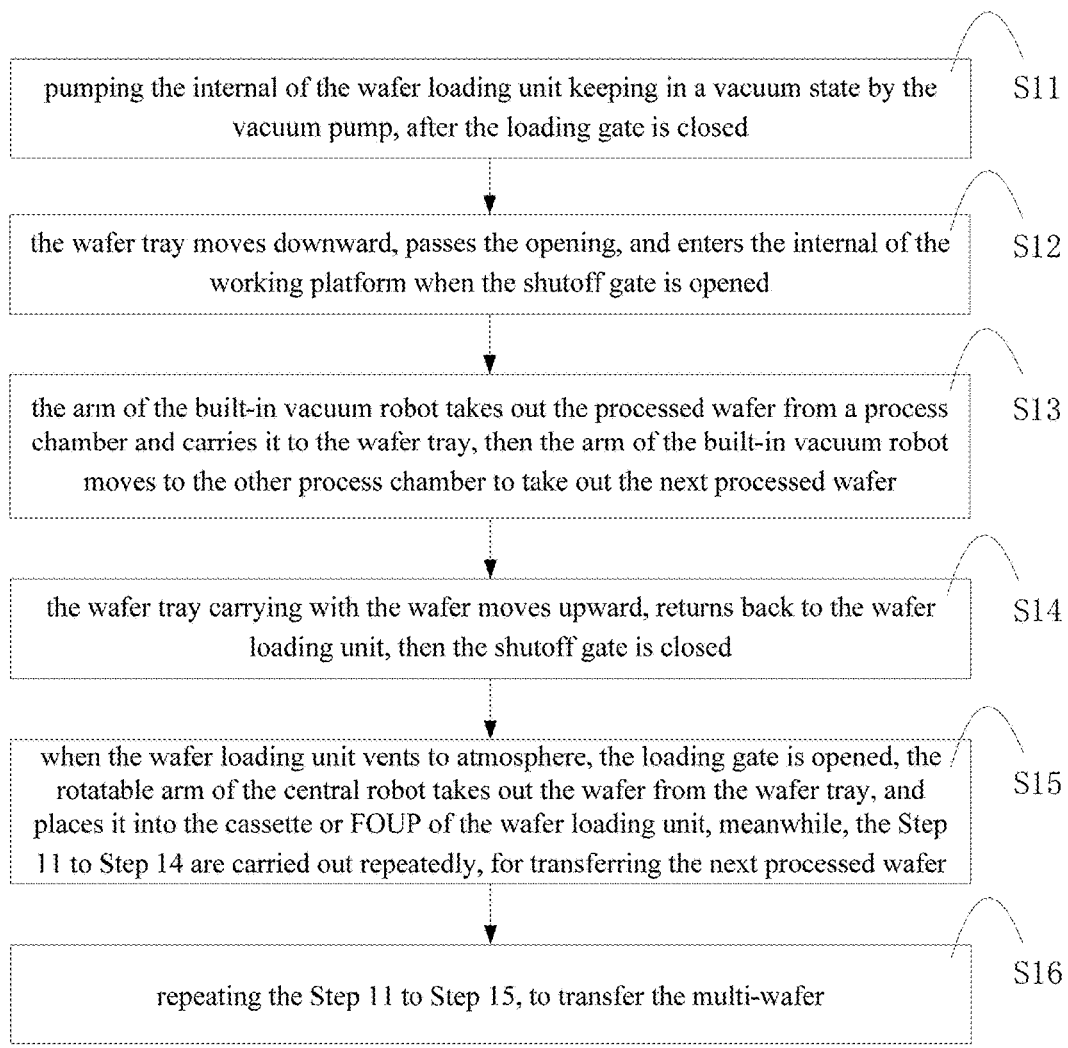
FIG. 10 is a flow diagram illustrating a method according to the wafer transfer according to another embodiment of the present invention

The above is the explanation of the structure of the equipment platform system according to the first embodiment of the present invention, the following is a further explanation of the wafer transfer method according to a second embodiment of the present invention with reference to FIG. 9 and FIG. 10. It should be pointed out that all appended drawings adopt a very simplified form and imprecise scaling is merely used to assistant explain the embodiment of the invention conveniently and clearly.

Please referring to FIG. 9, FIG. 9 is a flow diagram illustrating a wafer transfer method according to an embodiment of the present invention. The wafer transfer method according to the embodiment of the present invention adopts the above-mentioned the equipment platform system as an example, the wafer transfer method includes a multi-wafer input procedure, and the multi-wafer input procedure includes:

Step 01: the rotatable arm of the central robot takes out the wafer from the cassette or FOUP of the cassette or FOUP loading unit. In the embodiment of the invention, at first the overhead transfer device transfers the cassette or FOUP to the cassette or FOUP loading unit of the equipment platform system; then the central robot rotates the rotatable arm to a suitable place to align the cassette or FOUP, afterward the rotatable arm takes out the wafer from the cassette or FOUP; there are several wafers in the cassette or FOUP.

Step 02: when the loading gate is opened, the rotatable arm carries the wafer to the wafer tray of the internal of the wafer loading unit, then the rotatable arm returns back to the outside of the loading gate, and moves to the cassette or FOUP to take the next wafer.

In the embodiment of the invention, the opening of the loading gate opens for waiting the rotatable arm transfers wafer to the wafer tray of the internal of the wafer loading unit. when the rotatable arm picks up the wafer, the rotatable arm passes the loading gate by the spinning movement, then put the wafer on the wafer tray, and returns back to the outside of the loading gate. Of course, it can be also that when the rotatable arm moves to the front of the loading gate with wafer, the loading gate opens at this time. Preferably, the wafer tray of the example has a wafer pallet and a retractable shaft, the rotatable arm places the wafer onto the wafer pallet.

It should be pointed out that when the loading gate is in opening state, the shutoff gate is always in closing state, this is to ensure that the vacuum state of the internal of the hexagonal working platform is not destroyed.

Step 03: after the loading gate is closed, the vacuum pump pumps down the internal of the wafer loading unit keeping in the vacuum state as same as the vacuum state of the working platform.

In the embodiment of the invention, the internal of the hexagonal working platform is in the vacuum state, if the internal of the wafer loading unit is not in the vacuum state, the vacuum state of the internal of the hexagonal working platform will be destroyed when the wafer tray transfers wafer to the hexagonal working platform, and the processes in the process chambers of the hexagonal working platform may be impacted. Therefore, before transferring the wafer to the internal of the hexagonal working platform, the internal of the wafer loading unit shall be in closed state and be in vacuum state.

It should be pointed out that during the transferring of the wafer, the shutoff gate is always in closed state before the wafer entering the hexagonal working platform, in order to avoid the air into the hexagonal working platform to destroy the vacuum state of the internal of the hexagonal working platform.

Step 04: the arm of the built-in vacuum robot of the working platform moves to the lower part of the opening at the top of the working platform when the shutoff gate is opened again;

In the embodiment of the invention, when the internal of the wafer loading unit has been keeping in vacuum state, the pressure in the internal of the wafer loading unit is almost equal to the pressure in the internal of the hexagonal working platform. On the condition, the shutoff gate can open; in the meantime, the arm of the built-in vacuum robot of the hexagonal working platform moves to the lower part of the opening which is at the top of the hexagonal working platform, and is waiting to receive the wafer transferred by the wafer tray. The arm of the built-in vacuum robot moves to the lower part of the opening when may be before the open of the shutoff gate or after the open of the shutoff gate, but before the coming of the wafer tray.

Step 05: the wafer tray with the wafer moves downward, and passes the opening and enters the internal of the working platform, the arm of the built-in vacuum robot takes out the wafer from the wafer tray.

Specifically, in the embodiment of the invention, the wafer pallet of the wafer tray carrying with the wafer passes the opening and enters the internal of the hexagonal working platform, when the wafer pallet moves downward to be in the same plane with the arm of the built-in vacuum robot, the wafer is placed on the arm of the built-in vacuum robot, then the arm of the built-in vacuum robot withdraws, and takes out the wafer from the wafer pallet.

Step 06: the wafer tray moves upward, returns back to the internal of the wafer loading unit, and then the shutoff gate is closed.

In the embodiment of the invention, the wafer pallet of the wafer tray can move upward by the driving of the retractable shaft, returns back to the internal of the wafer loading unit, then the shutoff gate is closed.

It should be pointed out that the loading gate is always in close state, the internal of the wafer loading unit is in vacuum state after the wafer enters the wafer loading unit, in order to avoid the air into the hexagonal working platform to destroy the vacuum state of the internal of the hexagonal working platform.

Step 07: the arm of the built-in vacuum robot transfers the wafer into the process chamber, meanwhile, repeats the Step 02 to Step 06 to transfer the next wafer.

The shutoff gate should be closed in time after the wafer tray has be taken away, in order to further ensure the vacuum state of the internal of the hexagonal working platform; and then the arm of the built-in vacuum robot carries the wafer to the corresponding process chamber.

Step 08: repeating Step 01 to Step 07 until the multi-wafer had be transferred. In the embodiment of the invention, the loading gate is opened after the shutoff gate closed, the wafer tray receives the next wafer, and repeats the Step 01 to Step 07 above, to realize the continuous transfer of the multi-wafer.

Now, please referring to FIG. 10, FIG. 10 is a flow diagram illustrating a wafer transfer method according to another embodiment of the present invention. The wafer transfer method according to the embodiment of the present invention includes a multi-wafer output procedure, which is reverse procedure of the multi-wafer input procedure mentioned above-, includes:

Step 11: pumping the internal of the wafer loading unit keeping in a vacuum state by the vacuum pump, after the loading gate is closed.

Before the pumping, the loading gate should be closed, in order to ensure the internal of the wafer loading unit in closed state, the also ensure the vacuum state of the internal of the hexagonal working platform when taking out wafers from the hexagonal working platform to outside.

Step 12: the wafer tray moves downward, passes the opening, and enters the internal of the working platform when the shutoff gate is opened;

As the internal of the wafer loading unit is keeping in vacuum state, at the time, the shutoff gate should be opened when the pressure in the internal of the wafer loading unit is basically the same as the pressure in the internal of the hexagonal working platform; then the wafer tray passes the opening and enters the internal of the hexagonal working platform, until locating in the same horizontal plane with the arm of the built-in vacuum robot.

Step 13: the arm of the built-in vacuum robot takes out the processed wafer from a process chamber and carries it to the wafer tray, then the arm of the built-in vacuum robot moves to the other process chamber to take out the next processed wafer.

In the embodiment of the invention, when the wafer pallet of the wafer tray moves downward to the lower part of the opening, the arm of built-in vacuum robot takes out a wafer from the corresponding process chamber, and carries the processed wafer and moves to one side of the lower part of the opening, then places the wafer into the slot of the wafer pallet.

It should be pointed out that the loading gate is in close state, when the wafer tray moves and enters the internal of the hexagonal working platform to take out a wafer.

Step 14: the wafer tray carrying with the wafer moves upward, returns back to the inside of the wafer loading unit, then the shutoff gate is closed. In the next moment, the built-in vacuum robot returns back and moves to the other process chamber to take out a wafer, or wait the wafer tray's coming to transfer the wafer again.

It should be pointed out that the loading gate is always in close state before the close of the shutoff gate, in order to ensure the vacuum state of the internal of the hexagonal working platform not destroyed.

Step 15: when the wafer loading unit vents to atmosphere, the loading gate is opened, the rotatable arm of the central robot takes out the wafer from the wafer tray, and places it into the cassette or FOUP of the wafer loading unit, meanwhile, the Step 11 to Step 14 are carried out repeatedly, for transferring the next processed wafer.

When the shutoff gate has been closed, the loading gate can be opened, the rotatable arm of the central robot rotates and enters the internal of the wafer loading unit, takes out the wafers, and returns back and places the wafers into the cassette or FOUP of the cassette or FOUP loading unit.

Step 16: repeating the Step 11 to Step 15, to transfer the multi-wafer. It should be pointed out that after Step 15, the loading gate is closed, and the wafer tray moves downward to receive the next wafer, repeats the above-mentioned procedures to realize the continuous transfer of the multi-wafer.

Of course, the procedures also includes: the overhead transfer device takes away the cassette or FOUP filled with the processed wafers.

In the embodiment of the invention, the multi-wafer input procedure and the multi-wafer output procedure can be in progress alternately, in other words, the input procedure transfers the wafers into the process chambers, and the output procedure transfers the processed wafers to the cassette or FOUP after the wafers are processed. The multi-wafer input procedure can continue until all the wafers are transferred into each of the process chambers. The multi-wafer out procedure can continue until all processed wafers are transferred into the cassette or FOUP, then the multi-wafer input procedure and multi-wafer output procedure continue to process the next lot of wafers.

Embodiment Three

Figure 11:
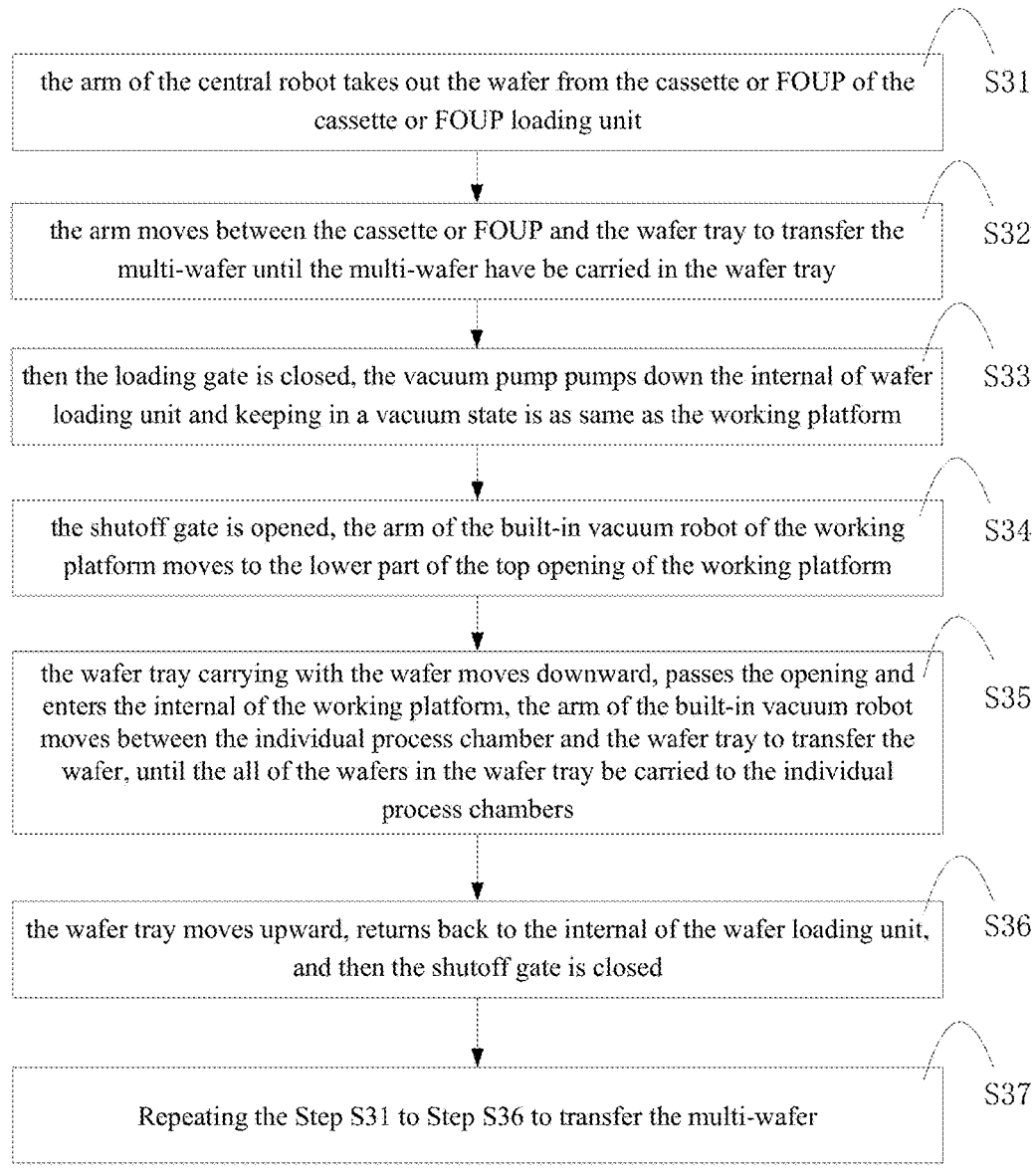
FIG. 11 is a flow diagram illustrating a method according to the wafer transfer according to a third embodiment of the present invention
Figure 12:
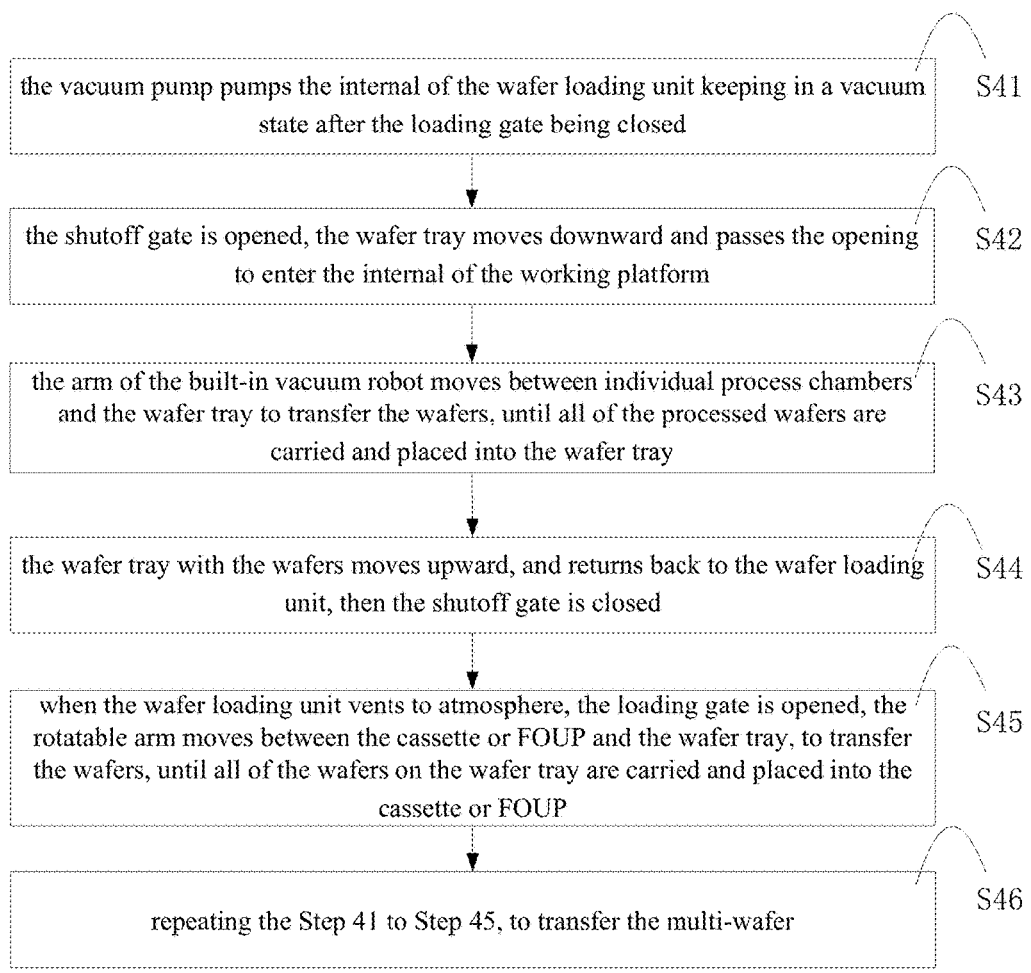
FIG. 12 is a flow diagram illustrating a method according to the wafer transfer according to another embodiment of the present invention

With reference to FIG. 11 and FIG. 12, the wafer transfer method according to the present invention will be further explained. It should be pointed out that all appended drawings adopt a very simplified form and imprecise scaling is merely used to assistant explain the embodiment of the invention conveniently and clearly.

Please referring to FIG. 11, FIG. 11 a flow diagram illustrating a wafer transfer method according to a third embodiment of the present invention. The wafer transfer method according to the preferred embodiment of the invention adopts the above-mentioned equipment platform system, the wafer transfer method includes a multi-wafer input procedure, and the multi-wafer input procedure includes:

Step 31: the arm of the central robot takes out the wafer from the cassette or FOUP of the cassette or FOUP loading unit.

In the embodiment of the invention, at first, the overhead transfer device carries the wafer box to the cassette or FOUP loading unit of the equipment platform system; then the arm of the central robot rotates to a proper position to align the cassette or FOUP, then the arm takes out the wafers from the cassette or FOUP; wherein there are several wafers in the cassette or FOUP.

Step 32: the arm moves between the cassette or FOUP and the wafer tray to transfer the multi-wafers until the multi-wafers have be carried in the wafer tray.

In the embodiment of the invention, as the wafer pallet of the wafer tray can carry several wafers at one time, the rotatable arm takes out the wafers and places them into the wafer pallet repeatedly, until the wafer pallet carries with the several wafers or is filled with the wafers, there are not limited in this invention then the loading gate is closed, the next Step 33 can be processed.

The wafer pallet has several slots, the wafers should be correspondingly placed into one of the slots.

It should be pointed out that, when the loading gate is in the opening state, the shutoff gate is always in the closing state, in order to ensure the vacuum state of the internal of the hexagonal working platform not destroyed.

Step 33: then the loading gate is closed, the vacuum pump pumps down the internal of wafer loading unit and keeping in a vacuum state is as same as the working platform.

In the embodiment of the invention, the internal of the hexagonal working platform is in vacuum state, if the internal of the wafer loading unit is not in vacuum state, the vacuum state of the internal of the hexagonal working platform will be destroyed when the wafer tray transfers the wafer to the hexagonal working platform, which will impact the processing of the working platform's process chamber. Therefore before transferring the wafer to the internal of the hexagonal working platform, the internal of the wafer loading unit should be in closed and vacuum state.

It should be pointed out that when the wafer is carried and before entering the hexagonal working platform, the shutoff gate is always in closed state, in order to avoid air and like coming into the hexagonal working platform and destroying the vacuum state of the internal of the hexagonal working platform.

Step 34: the shutoff gate is opened, the arm of the built-in vacuum robot of the working platform moves to the lower part of the top opening of the working platform;

In the embodiment of the invention, when the internal of the wafer loading unit is in vacuum state, the pressure in the internal of the wafer loading unit is basically equal to the pressure in the internal of the hexagonal working platform, only in the way the shutoff gate can be opened; meanwhile, the arm of the built-in vacuum robot of the hexagonal working platform moves to the lower part of the top opening of the hexagonal working platform, waiting to receive the wafer transferred by the wafer tray.

Step 35: the wafer tray carrying with the wafer moves downward, passes the opening and enters the internal of the working platform, the arm of the built-in vacuum robot moves between the individual process chamber and the wafer tray to transfer the wafer, until the all of the wafers in the wafer tray be carried to the individual process chambers.

Specifically, in the embodiment of the invention, the wafer pallet of the wafer tray carries multi-wafer, the arm of the built-in vacuum robot places a wafer into a process chamber, and returns back to take the next wafer from the wafer pallet, and sends it to the other process chamber, repeats the above-mentioned procedure, until all wafers in the wafer pallet are taken out and carried to the individual process chambers, then the wafer tray returns back to the wafer loading unit, the shutoff gate is closed.

Step 36: the wafer tray moves upward, returns back to the internal of the wafer loading unit, and then the shutoff gate is closed.

It should be pointed out that, during the whole procedure after the wafer enters the wafer loading unit, the loading gate should be in closed state, and the internal of the wafer loading unit should be in vacuum state, in order to ensure the vacuum state of the internal of the hexagonal working platform not destroyed in the wafer transporting procedure.

After the leaving of the wafer tray, the shutoff gate should be closed in time, in order to further ensure the vacuum state of the internal of the hexagonal working platform.

Step 37: repeating the Step 31 to Step 36 to transfer the multi-wafer

In the embodiment of the invention, after the shutoff gate is closed, the loading gate is opened, and the wafer pallet receives the next lot of the wafers, the above-mentioned procedure is repeated, to realize the continuous transfer of the multi-wafer.

Please referring to FIG. 12, FIG. 12 is a flow diagram illustrating a wafer transfer method according to another embodiment of the present invention. The wafer transfer method according to the embodiment includes a multi-wafer output procedure, the multi-wafer output procedure is the reverse procedure of the multi-wafer input procedure in the above mentioned embodiment, includes:

Step 41: the vacuum pump pumps the internal of the wafer loading unit keeping in a vacuum state after the loading gate being closed.

Before pumping, the loading gate should be closed, in order to ensure the internal of the wafer loading unit in closed state, also ensure the vacuum state of the internal of the hexagonal working platform not destroyed when taking out the wafer from the hexagonal working platform.

Step 42: the shutoff gate is opened, the wafer tray moves downward and passes the opening to enter the internal of the working platform;

After the internal of the wafer loading unit is in vacuum state, the pressure in the internal of the wafer loading unit is basically equal to the pressure in the internal of the hexagonal working platform, in such cases, the shutoff gate can be opened; then the wafer tray passes the opening and enters the internal of the hexagonal working platform, and moves until it is in the same plane with the arm of the built-in vacuum robot.

Step 43: the arm of the built-in vacuum robot moves between individual process chambers and the wafer tray to transfer the wafers, until all of the processed wafers are carried and placed into the wafer tray, then the next Step 44 is executed.

It should be pointed out that, the wafers processed by the process chambers are perhaps not processed at the same time, only processed wafers are carried to the wafer tray at the moment, the other wafers are still in processing in the process chambers; since the wafer tray of the embodiment is with the multi-slots, the wafers can be placed into the corresponding multi-slots.

In the preferred embodiment, during the progress the wafer tray moves and enters the internal of the hexagonal working platform to take the wafers, the loading gate is in closed state.

Step 44: the wafer tray with the wafers moves upward, and returns back to the wafer loading unit, then the shutoff gate is closed; then the built-in vacuum robot returns back and moves to the other process chamber to take the wafer, or waits the wafer tray to transfer the wafer again.

It should be pointed out that before the shutoff gate is closed, the loading gate is always in closed state, in order to ensure the vacuum state of the internal of the hexagonal working platform not destroyed.

Step 45: when the wafer loading unit vents to atmosphere, the loading gate is opened, the rotatable arm moves between the cassette or FOUP and the wafer tray, to transfer the wafers, until all of the wafers on the wafer tray are carried and placed into the cassette or FOUP.

In the preferred embodiment, since the wafer tray can carry the multi-wafer at the same time, the arm moves between the cassette or FOUP and the wafer tray to transfer the multi-wafer after the loading gate is opened, until all wafers on the wafer tray are carried to the inside of the cassette or FOUP.

Step 46: repeat step 41 to step 45, to transfer the multi-wafer to the inside of the cassette or FOUP;

In the preferred embodiment, since the wafer tray can carry the multi-wafer at the same time, after processed wafers are carried to the inside of the cassette or FOUP, there are still some wafers not finish the processing as mentioned before, the proceed of the Step 41 to Step 45 need to repeat, until all processed wafers are carried to the inside of cassette or FOUP.

Of course, the procedure still includes: the overhead transfer device take away the cassette or FOUP filled with processed wafers.

In the embodiment of the invention, the multi-wafer input procedure and the multi-wafer output procedure can be in progress alternately, in other words, the input procedure to carry the wafers into the process chambers at first, the processed wafers are carried to the inside of the cassette or FOUP after processing. The multi-wafer input procedure can carry on until the wafers are carried to all the process chambers, the multi-wafer output procedure can carry on until all the processed wafers are carried back to the inside of the cassette or FOUP, then the multi-wafer input and the output procedures of the next lot of the wafers will be carried out.

In summary, the equipment platform system and the wafer transfer method thereof for the wafer processing of the invention is realized by means of the adopting the top-loading wafer device. The cassette or FOUP loading unit, the wafer loading unit and the central robot are in the top-loading wafer device, the transfer of wafers from the cassette or FOUP loading unit to the wafer loading unit should be realized. The loading gate is provided on the wafer loading unit, the vacuum state of the internal of the wafer loading unit can be controlled by the open/close of the loading gate, and avoided the vacuum state of the internal of the working platform may be destroyed during the transfer procedure. The wafer tray and the shutoff gate are installed on the internal of the wafer loading unit and the opening are installed at the top of the working platform disposed opposite the shutoff gate, which realizes the direct transfer of the wafers from the internal of the wafer loading unit to the internal of the working platform, and the built-in vacuum robot moving between the wafer loading unit and the working platform to take out or place the wafer does not need. The cooperation of the open/close of the shutoff gate and the open/close of the loading gate, ensures the working platform always has been keeping in vacuum state during the wafer entering the internal of the working platform, further ensures the process stability of the process chamber. So the means by adopting the top-loading wafer device, not only decreases the floor space, increases the space efficiency, but also increases the number of the process chambers mounted on the working platform, further increases the transfer efficiency of the wafers.

While the invention has been particularly shown and described with references to preferred embodiments thereof, if will be understood by those skilled in the art that various changes in form and details may be made herein without departing from the spirit and scope of the invention as defined by the appended claims.

The invention claimed is:

1. An equipment platform system for wafer processes, comprising:
a working platform, each side of the working platform is used for mounting process chambers;
a top-loading wafer device, fixed at a top surface of the working platform; the top-loading wafer device includes:
a cassette or FOUP loading unit, which is used for loading the cassette or FOUPs;
a wafer loading unit, used for loading wafers, disposed opposite the cassette or FOUP loading unit, and the wafer loading unit has an inside cavity;
a central robot, which has a rotatable arm, the central robot is located between the cassette or FOUP loading unit and the wafer loading unit, used to support the rotatable arm; the rotatable arm is installed on the central robot, and rotates around the central robot, used for transferring the wafers between the cassette or FOUP loading unit and the wafer loading unit;
a loading gate, located on the wafer loading unit, disposed opposite the cassette or FOUP loading unit, the inside cavity of the wafer loading unit is opened or closed by the open/close of the loading gate;
a wafer tray, locating in the inside cavity, and moving upward and downward for transferring the wafers between the inside cavity and the internal of the working platform;
a shutoff gate, located at the bottom of the inside cavity, the inside cavity and the internal of the working platform can be opened or closed at the same time by the open/close of the shutoff gate, in order to connect or separate the space of the internal of the working platform and the inside cavity;
the top of the working platform has an opening, the opening is under the inside cavity, used for enabling the wafer tray carrying with wafers to move between the inside cavity and the internal of the working platform; the opening is disposed opposite the shutoff gate, and the shutoff gate can seal the opening.

2. The equipment platform system according to claim 1, wherein the working platform is a polygon shaped working platform.

3. The equipment platform system according to claim 2, wherein the polygamous working platform is a hexagonal working platform.

4. The equipment platform system according to claim 1, further comprising a built-in vacuum robot located inside the working platform, the arm of the built-in vacuum robot can extend to a lower part of the opening.

5. The equipment platform system according to claim 1, wherein the wafer tray includes a wafer pallet and a retractable shaft.

6. The equipment platform system according to claim 5, wherein the wafer pallet has a multilayer slot for carrying the wafers.

7. The equipment platform system according to claim 1, wherein the size of the opening allows the wafer tray to pass the opening, and the every edge of the opening is smaller than the every edge of the shutoff gate.

8. The equipment platform system according to claim 1, wherein the open/close direction of the loading gate is vertical.

9. The equipment platform system according to claim 1, wherein the central robot can move upward and downward.

10. The equipment platform system according to claim 1, wherein the loading gate is disposed opposite the cassette or FOUP loading unit.

11. The equipment platform system according to claim 1, wherein the shutoff gate is vertical to the loading gate.

12. The equipment platform system according to claim 1, wherein the wafer loading unit includes a vacuum pump for pumping down the internal of the wafer loading unit into a vacuum state.

13. A wafer transfer method that adopts the equipment platform system described in claim 1; the method comprises a multi-wafer input procedure, the wafer input procedure comprising:
  Step 01: the rotatable arm of the central robot takes out a wafer from the cassette or FOUP of the cassette or FOUP loading unit;
  Step 02: the loading gate is opened, the rotatable arm carries the wafer to the wafer tray of the internal of the wafer loading unit, then the rotatable arm returns back to the outside of the loading gate, and moves to the cassette or FOUP to take the next wafer;
  Step 03: the loading gate is closed, the vacuum pump pumps down the internal of the wafer loading unit into a vacuum state;
  Step 04: the shutoff gate is opened, the arm of the built-in vacuum robot of the working platform moves to a lower part of the opening at the top of the working platform;
  Step 05: the wafer tray carrying the wafer moves downward, and passes the opening and enters the internal of the working platform, the arm of the built-in vacuum robot takes out the wafer from the wafer tray;
  Step 06: the wafer tray moves upward, returns back to the internal of the wafer loading unit, and then the shutoff gate is closed;
  Step 07: the arm of the built-in vacuum robot transfers the wafer into a process chamber of said process chambers, meanwhile, the Step 02 to Step 06 are carried out repeatedly, for transferring the next processed wafer;
  Step 08: repeating the Step 01 to Step 07, for transferring a multi-wafer.

14. The wafer transfer method according to claim 13, further comprising a multi-wafer output procedure, the multi-wafer output procedure comprising:
  Step 11: the loading gate is closed, the vacuum pump pumps down the internal of the wafer loading unit into a vacuum state;
  Step 12: the shutoff gate is opened, the wafer tray moves downward and passes the opening and enters the internal of the working platform;
  Step 13: the arm of the built-in vacuum robot takes out the processed wafer from the process chamber and carries and places it into the wafer tray, then the arm of the built-in vacuum robot moves to another process chamber to take out the next processed wafer;
  Step 14: the wafer tray carrying the wafer moves upward, returns back to the internal of the wafer loading unit, then the shutoff gate is closed;
  Step 15: when the wafer loading unit vents to atmosphere, the loading gate is opened, the rotatable arm of the central robot takes out the wafer from the wafer tray, and places it into the cassette or FOUP of the wafer loading unit, meanwhile, the Step 11 to Step 14 are carried out repeatedly, for transferring the next processed wafer;
  Step 16: repeating the Step 11 to Step 15, to transfer the multi-wafer.

15. The wafer transfer method according to claim 14, wherein the multi-wafer input procedure and the multi-wafer output procedure can alternately be in progress.

16. The wafer transfer method according to claim 13, wherein the wafer transfer method includes a multi-wafer input procedure, the multi-wafer input procedure includes:
  Step 31: the rotatable arm of the central robot takes out the wafer from the cassette or FOUP of the cassette or FOUP loading unit;
  Step 32: the rotatable arm moves between the cassette or FOUP and the wafer tray to transfer the multi-wafer until the multi-wafer have been carried in the wafer tray;
  Step 33: then the loading gate is closed, the vacuum pump pumps down the internal of the wafer loading unit into a vacuum state;
  Step 34: the shutoff gate is opened, the arm of the built-in vacuum robot of the working platform moves to the lower part of the top opening of the working platform;
  Step 35: the wafer tray carrying the wafer moves downward, passes the opening and enters the internal of the working platform, the arm of the built-in vacuum robot moves between the individual process chamber and the wafer tray to transfer the wafer, until all of the wafers in the wafer tray have been carried to the individual process chambers;
  Step 36: the wafer tray moves upward, returns back to the internal of the wafer loading unit, and then the shutoff gate is closed;
  Step 37: repeating the Step 31 to Step 36, to transfer the multi-wafer.

17. The wafer transfer method according to claim 16, wherein the method includes a multi-wafer output procedure, the multi-wafer output procedure includes:
  Step 41: the vacuum pump pumps the internal of the wafer loading unit into a vacuum state after the loading gate being closed;
  Step 42: the shutoff gate is opened, the wafer tray moves downward and passes the opening to enter the internal of the working platform;
  Step 43: the arm of the built-in vacuum robot moves between individual process chambers and the wafer tray to transfer the wafers, until all of the processed wafers are carried and placed into the wafer tray;
  Step 44: the wafer tray with the wafers moves upward, and returns back to the wafer loading unit, then the shutoff gate is closed;
  Step 45: when the wafer loading unit vents to atmosphere, the loading gate is opened, the rotatable arm moves between the cassette or FOUP and the wafer tray, to transfer the wafers, until all of the wafers on the wafer tray are carried and placed into the cassette or FOUP;
  Step 46: repeating the Step 41 to 45, to transfer the multi-wafer.

18. The wafer transfer method according to the claim 17, wherein the multi-wafer input procedure and the multi-wafer output procedure can alternately be in progress.

* * * * *